(12) United States Patent
Yang et al.

(10) Patent No.: US 10,872,895 B2
(45) Date of Patent: Dec. 22, 2020

(54) METHOD OF MANUFACTURING CAPACITOR STRUCTURE

(71) Applicant: TAIWAN SEMICONDUCTOR MANUFACTURING CO., LTD., Hsinchu (TW)

(72) Inventors: Tsung-Hsueh Yang, Taichung (TW); Chung-Chiang Min, Hsinchu County (TW); Chang-Ming Wu, New Taipei (TW); Shih-Chang Liu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 88 days.

(21) Appl. No.: 15/623,035

(22) Filed: Jun. 14, 2017

(65) Prior Publication Data

US 2017/0287915 A1 Oct. 5, 2017

Related U.S. Application Data

(62) Division of application No. 14/632,569, filed on Feb. 26, 2015, now Pat. No. 9,711,508.

(51) Int. Cl.
*H01L 27/108* (2006.01)
*H01L 49/02* (2006.01)
*H01L 21/768* (2006.01)

(52) U.S. Cl.
CPC .. *H01L 27/10808* (2013.01); *H01L 21/76831* (2013.01); *H01L 27/10852* (2013.01); *H01L 28/90* (2013.01); *H01L 27/1085* (2013.01); *H01L 27/10811* (2013.01); *H01L 27/10847* (2013.01); *H01L 27/10855* (2013.01)

(58) Field of Classification Search
CPC ......... H01L 27/10811; H01L 27/10855; H01L 27/76831; H01L 27/10808; H01L 27/10847; H01L 27/1085; H01L 21/76831
See application file for complete search history.

(56) References Cited

U.S. PATENT DOCUMENTS

| | | | |
|---|---|---|---|
| 5,821,140 A * | 10/1998 | Jost | H01L 21/768 438/241 |
| 6,255,168 B1 * | 7/2001 | Gau | H01L 21/76802 257/E21.577 |
| 6,284,589 B1 | 9/2001 | Lim | |
| 6,341,056 B1 * | 1/2002 | Allman | H01G 4/20 257/295 |

(Continued)

FOREIGN PATENT DOCUMENTS

CN 101740545 A 6/2010

*Primary Examiner* — Monica D Harrison
*Assistant Examiner* — John Lin
(74) *Attorney, Agent, or Firm* — Maschoff Brennan

(57) ABSTRACT

A method of manufacturing a semiconductor device includes forming a source/drain region in a substrate. An interlevel dielectric layer is formed on the substrate. A conducting plug is formed in the interlevel dielectric layer. The conducting plug is electrically coupled to the source/drain region. A crown oxide is formed on the interlevel dielectric layer. A deep trench is formed in the crown oxide to expose a top wall and a sidewall of the conducting plug. A spacer is formed on the sidewall of the conducting plug. A metal-insulator-metal film is formed in the deep trench.

20 Claims, 9 Drawing Sheets

(56) References Cited

U.S. PATENT DOCUMENTS

| | | | |
|---|---|---|---|
| 6,359,302 B1* | 3/2002 | Parekh | H01L 27/10888 257/303 |
| 2002/0011618 A1 | 1/2002 | Ishibashi et al. | |
| 2002/0113237 A1* | 8/2002 | Kitamura | H01L 23/485 257/71 |
| 2002/0167037 A1* | 11/2002 | Lee | H01L 21/76831 257/301 |
| 2010/0127316 A1 | 5/2010 | Tu et al. | |
| 2010/0127398 A1 | 5/2010 | Kim | |
| 2010/0224925 A1* | 9/2010 | Ching | H01L 27/0629 257/301 |

\* cited by examiner

METHOD OF MANUFACTURING CAPACITOR STRUCTURE

CROSS-REFERENCE TO RELATED APPLICATION

This application is a divisional of U.S. patent application Ser. No. 14/632,569, filed Feb. 26, 2015, which is herein incorporated by reference in its entirety.

BACKGROUND

Dynamic random access memory (DRAM) circuits are widely used in graphic and processor applications for storing data. The DRAM circuit includes a number of memory cells, and each cell has a capacitor and a transfer transistor. The capacitor stores binary data, while the transfer transistor retains the charge. In the read cycle, the transfer transistor interrogates the cells through bit lines. A field effect transistor is commonly used as the transfer transistor. The capacitor generally includes two electrodes separated by a barrier, for example, insulating material, to provide isolation.

Memory cells are likely to appear in two types, which include a deep trench (DT) capacitor formed in the substrate under the transfer transistors and a cell having a stacked capacitor that is built over and between transfer transistors. The physical size of electronic devices is ever reducing, and, as a result, the number of memory cells on a DRAM chip has increased dramatically in a short period. In the case of DT capacitor, the deep trench is made smaller to conserve space on the substrate for other components. The downsizing can lead to a significant reduction in the perimeter of the deep trench, and the electrical charge capability of the capacitor is strongly associated with the surface area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
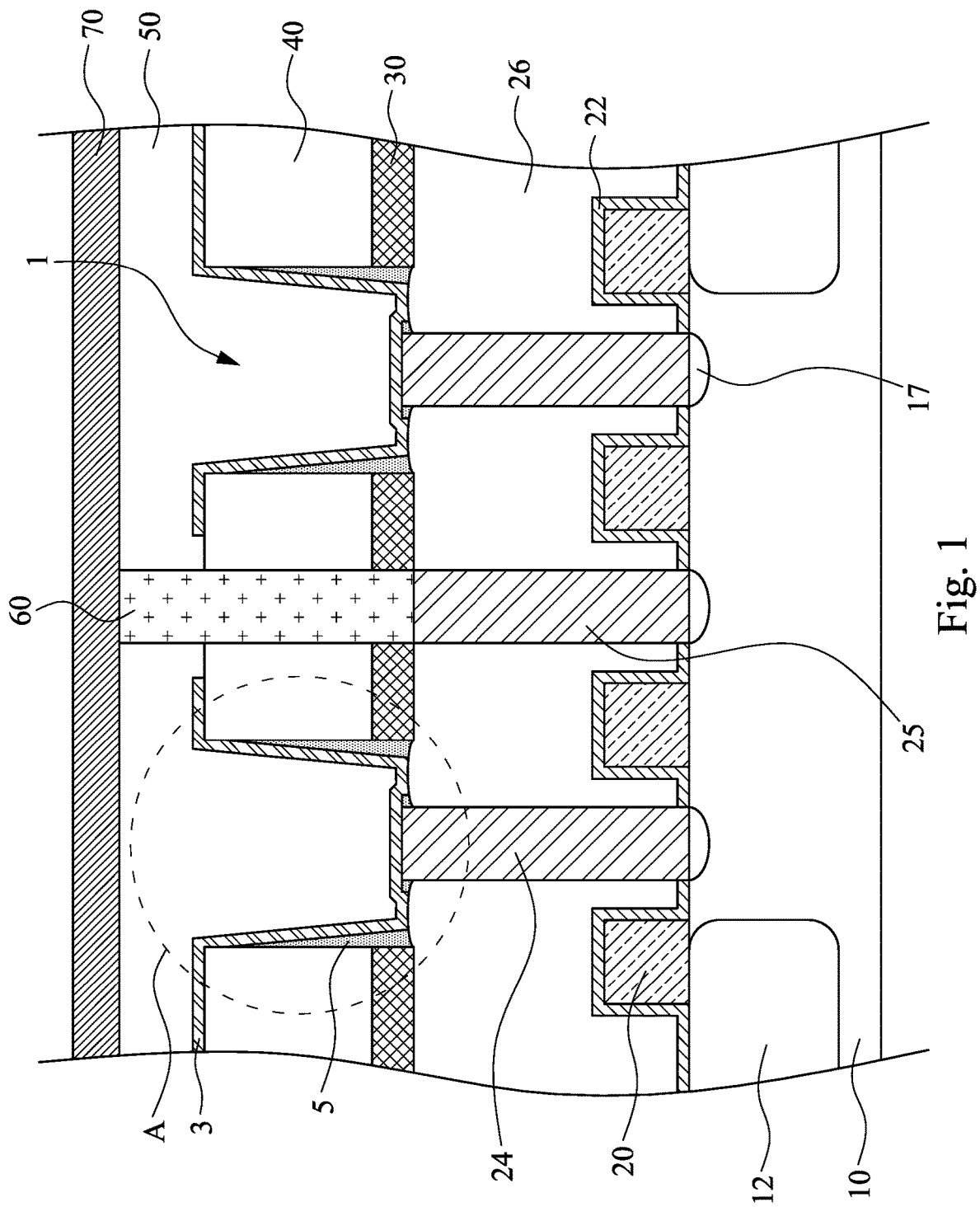
FIG. 1 is a schematic elevation cross-sectional view showing a capacitor-under-bit-line (CUB) DRAM cell in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Compact integrated circuits provide many advantages, for example, reduction in signal propagation time and noise susceptibility, higher clock frequencies and larger circuit real estate. Meanwhile, memory cell electrodes must provide sufficient surface area for electrical charge. The surface area is directly proportional to the charge holding capacity, referred to as capacitance. In order to increase surface area, deep trench technique has been developed to boost capacitance in a given area. The fabrication of deep trenches in substrate is a means of making charge storage cells, known as DT capacitors. In a metal-insulator-metal (MIM) capacitor, which is linear in its response characteristics and therefore commonly used in the logic device instead of poly-insulator-poly (PIP) capacitor, the deep trench is lined with dielectric material, and the surface area of the dielectric film is directly proportional to the capacitance. However, some adverse effects have been discovered in the deep trench capacitor which is one of the fundamental components required to design a feasible device.

The depth of deep trenches increases, while the width remains mostly unchanged. As a result, it leads to a high aspect ratio, which is defined as the ratio of the depth of the etched structure relative to its width (i.e., if in a plan view, the structure is square or rectangular) or to its diameter (i.e., if in a plan view, the structure is circular or elliptical in shape). The profile and shape control of the deep trench is very important for the subsequent process because multiple films are conformingly deposited to the deep trench. The deep trench etching process can be relatively complex. Etching is performed in equipment where gaseous species, usually containing $Cl_2$, F and Br, are ionised. A commonly seen issue is leakage when the films are crammed to a narrow corner.

In high capacity dynamic memories where data may be stored as a few hundred or fewer individual electrons, the storage mechanism is inevitably highly transitory. Leakage of a few electrons alone can alter data states of a stored bit, for example, 1 to 0 or 0 to 1. At the same time, high refresh rates are required to prevent data corruption. In turn, significant time as well as power is consumed due to high refresh rates, and a mostly undesired scenario where the memory access time increases. Such situation can severely compromise potential performance. Furthermore, even with the provision of redundant circuitry for a chip design, improper formation of a relatively small number of elements on the chip (where the number of such elements greatly jumps to provide desired increase of integration density and memory capacity) can result in a chip which ultimately fails to achieve its full function.

A dynamic random access memory (DRAM) cell may comprise any desired type, number, and combination of components, and these structures may be formed using any suitable process technique (e.g., processes similar to those used to fabricate integrated circuits). Also, it should be understood that the capacitor structure and, further, that the disclosed embodiments may find use in any application where it is desired to provide a smooth lamination or where a spacer is needed in trenches.

Attention is now invited to FIG. 1. FIG. 1 is a schematic elevation cross-sectional view showing a semiconductor substrate 10 having DRAM cells that is shown in partially completed state. The substrate 10 may be a bulk semiconductor substrate or a silicon-on-insulator substrate, has an array of memory cell on the memory device region and is electrically isolated by shallow trench isolation (STI) regions 12. The formation of the STI regions 12 may include etching trenches into the substrate, depositing isolating materials (oxide, nitride or combinations thereof) into the trenches, polishing off the excess isolating materials, and planarizing the trenches for the next level of fabrication. In some embodiments, the memory device region is an N-type well region for forming P-type transistors. In some embodiments, the memory device region is of P-type. A series of transfer transistor gate electrodes 20 are formed of for example, doped polysilicon, metals, metal alloys or silicides, on the substrate 10. Each two immediately adjacent gate electrodes 20 share a common bit-line contact. Liners (not shown) are formed on the sidewalls of the gate electrodes 20 by blanket depositing a dielectric layer and then etching. Lightly doped source/drain contact areas 17 are formed in the substrate 10 by implanting appropriate impurities with the liners. The source/drain contact areas interpose between adjacent gate electrodes 20. The types of the source/drain areas 17 depend on the types of the devices to be formed. Silicide regions (not shown) may be formed on the exposed regions of the gate electrodes 16 in order to reduce contact resistance. Because of the waved or crown-like contour of the gate electrodes 20, they are also known as crown capacitor.

Still referring to FIG. 1, a first etch stop layer 22 is conformingly formed on the gate electrodes 20 and a portion of the substrate 10. The stop layer may be made of, for example, silicon nitride ($Si_3N_4$). Typically, the first etch stop layer 22 is deposited by low pressure chemical vapour deposition (LPCVD). Next, an interlevel dielectric (ILD) layer 26 or sometimes referred to as a dielectric layer is deposited over the gate electrodes 20 that is blanketed by the first etch stop layer 22 and is then planarized. The First ILD layer 26 may include, for example, silicon oxide, low-k dielectric materials or the like and is deposited by but not limited to LPCVD. The First ILD layer 26 is deposited and planarized by chemical-mechanical polishing (CMP).

Subsequently, conventional photolithographic techniques and anisotropic plasma etching are used to etch through the First ILD layer 26 until exposing the underlying source/drain areas 17 to form contact openings for capacitor nodes and for the shared bit-line contacts. A conducting layer is deposited and fills the contact openings to form first conducting plugs 24 for capacitors and a second contact plug 25 for the bit lines. The conducting layer is composed of tungsten or tungsten alloys and deposited by LPCVD to a thickness sufficient to fill the contact openings. As shown in FIG. 1, a second etch stop layer 30 is deposited over the First ILD layer 26 and followed by a crown oxide 40. The crown oxide 40 is deposited over the stop layer 26 by LPCVD and planarized to a thickness determined by circuit design, but more specifically to a thickness of between 6000 and 8000 Angstroms.

Next, deep trenches 1 are formed in the crown oxide 40 aligned over the first contact plugs 24. The deep trenches 1 are etched using conventional photolithrographic techniques to recess the crown oxide 40, and the crown oxide 40 defines the height of the deep trenches 1. A spacer 5 lines the sidewalls of the deep trenches 1 and a metal-insulator-metal film 3 is conformingly deposited over the deep trenches 1. Materials of the spacer 5 may be, for example, silicon nitride (SiN) or the like. The metal-insulator-metal film 3 includes a bottom electrode layer contacting the first contact plugs 24, a capacitor dielectric layer and a top electrode layer overlying the bottom electrode layer in succession.

Still referring to FIG. 1, a second ILD layer 50 is deposited on the crown oxide 40 and fills in the deep trenches 1. In addition to filling the cup shaped region of the deep trenches 1, the second ILD layer 50 includes a portion with a thickness over the crown oxide 40. Materials used to form the second ILD oxide layer 50 include PE-CVD dielectric, HDP dielectric, doped dielectric materials comprising carbon and silicon, porous materials, and combination thereof. In some embodiments, the second ILD layer 50 is composed of fluorosilicate glass, carbon-doped silicate glass, and combinations thereof. Next, an anisotropic etching process, i.e., etch back process, or a planarization technique, i.e., chemical mechanical polish can be employed on the second ILD oxide layer 50.

Another contact opening is then formed through the second ILD oxide layer 50, the crown oxide 40 and the second etch stop layer 30, exposing the underlying second contact plug 25. Conductive materials are filled into the contact opening to form the bit-line conducting plug 60 that is electrically connected to the second contact plug 25 on the substrate 10. Materials of the bit-line conducting plug 60 include but not limited to tungsten, tungsten alloys, copper or copper alloys.

A conductive layer 70 is deposited on the second ILD layer 50 and patterned, forming a bitline in the memory cell region. The bitline is conductor line of copper or copper alloys. The bitline can electrically connect to the source/drain areas 17 through the bit-line contact plug 60 and the second contact plug 25.

Figure 2:
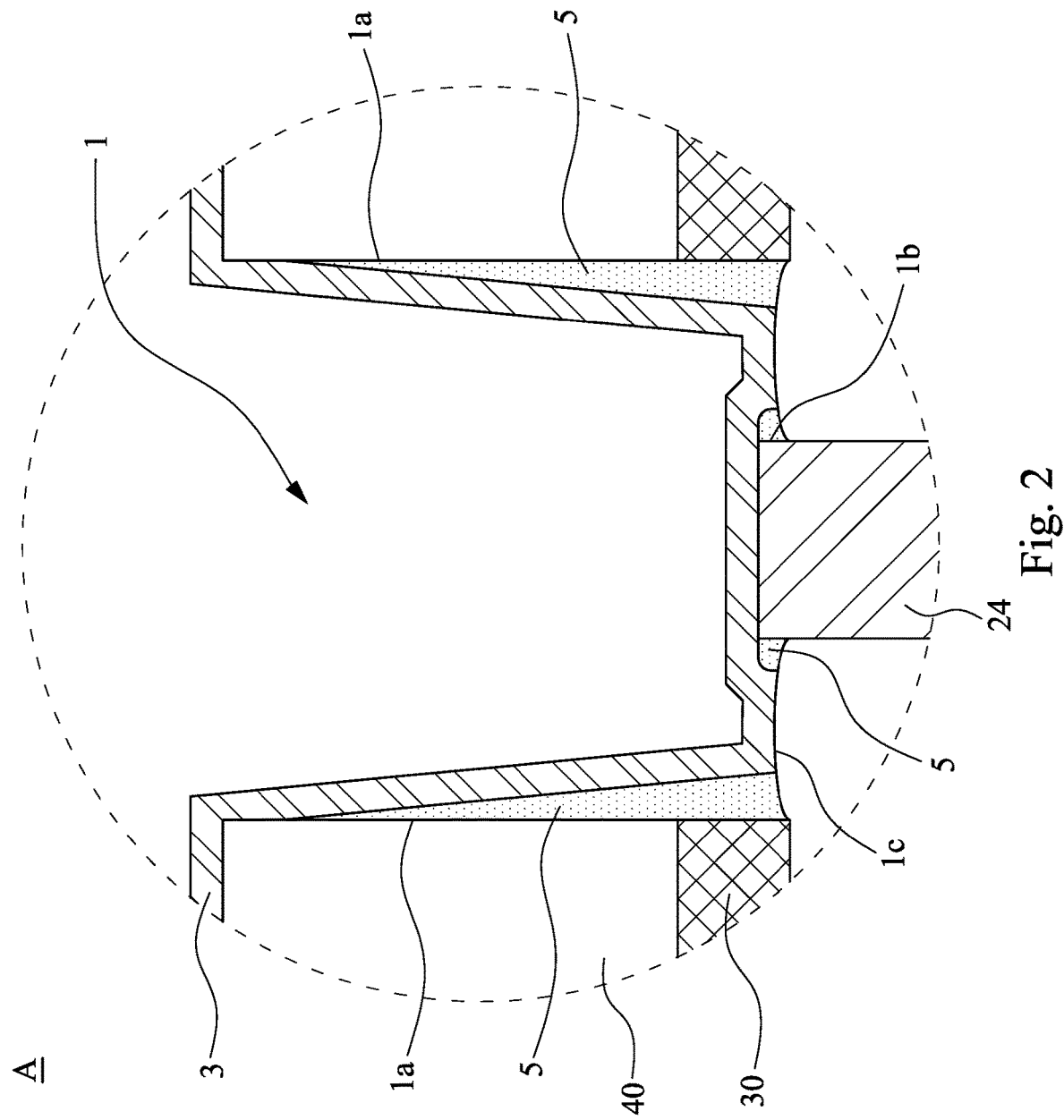
FIG. 2 is a close-up view of the area A as shown in FIG. 1.

Attention is now invited to FIG. 2. FIG. 2 is an enlarged view of region A circled by dotted line in FIG. 1. When etching the deep trench 1 by plasma dry etching, due to the desired narrow profile, sub-trenches appear at the corner of the deep trench 1. Sub-trenches occurs at the bottom region of the deep trench 1 where the trench turns its direction normally and when the trench encounters the first contact plug 24. The deep trench 1 has a pair of first sidewalls 1a, a pair of sidewalls 1b and a bottom 1c. The first sidewalls 1a are substantially in parallel and stand the way along the crown oxide 40 and the second etch stop layer 30. The deep trench 1 is recessed to expose the top of the first contact plug 24, and a slightly uneven or curved bottom 1c is formed. In the formation of the curved bottom 1c, an acute angle is formed between the bottom 1c and the first contact plug 24, and a small portion of the first contact plug 24 becomes the second sidewalls 1b of the deep trench 1. In other words, the bottom 1c is not entirely coplanar with the top of the first contact plug 24 because of the narrow profile of the deep trench 1 and drawbacks of an etching process, and the first contact plug 24 also help to define the bottom topology of the deep trench 1 by contributing the sidewalls 1b. The waved bottom 1c hides a number of corners that are difficult to reach or fill.

Still referring to FIG. 2, the metal-insulator-metal film 3 is deposited in the deep trench 1. The layers, namely the bottom electrode layer, capacitor dielectric layer and top electrode layer, conformingly grow along the deep trench 1. The contour of the metal-insulator-metal film 3 reflects the topology of the deep trench 1. The sub-trenches and acute angles will also be reproduced and worst case deteriorated to even narrower profile. Poor film deposition will induce leakage that is likely to lead to data state alter and even data corruption. The capacitor capacity can be seriously compromised. In order to prevent leakage caused by crammed metal-insulator-metal film 3, before the deposition of the film 3, the spacer 5 is deposited and then selectively etched such that the sub-trenches and acute corners are occupied by the spacer 5. In this regard, the bottom electrode layer follows the deep trench contour where the sub-trenches and acute corners are modified to obtuse angles.

It should be understood that spacer 5 does not cover the entire surface of the deep trench 1 but portions thereof. As shown in FIG. 2, spacer 5 is discrete and in non-uniform thickness. As a result, the sub-trench created between one sidewall 1a and the bottom 1c is not reproduced but transformed into a wider corner. When depositing the first layer of the metal-insulator-metal film 3, namely the bottom electrode layer, the layer follows the wider corner that is collectively defined by a portion of the spacer 5 and the bottom 1c of the deep trench 1. A rounder corner greatly reduces the chance of metal-insulator-metal film 3 being crammed when the capacitor dielectric layer and top electrode layer are deposited.

Likewise, the acute angle created between the bottom 1c and the sidewall of the first contact plug 24 is attenuated. Because of selective etching of the spacer 5, in addition to non-uniform thickness, a portion of the spacer 5 is retained at the acute angle. The acute corner is therefore transformed into an obtuse angle, leaving a more opened bottom to fill in. The bottom electrode layer is conformal to the topology created by the spacer 5, and therefore when the capacitor dielectric layer and the top electrode are deposited, the acute angles will not be reproduced and capacitor leakage can be minimized to an even greater extent. The smoothness of the metal-insulator-metal film 3 ensures the functionality of the capacitor.

Figure 3:
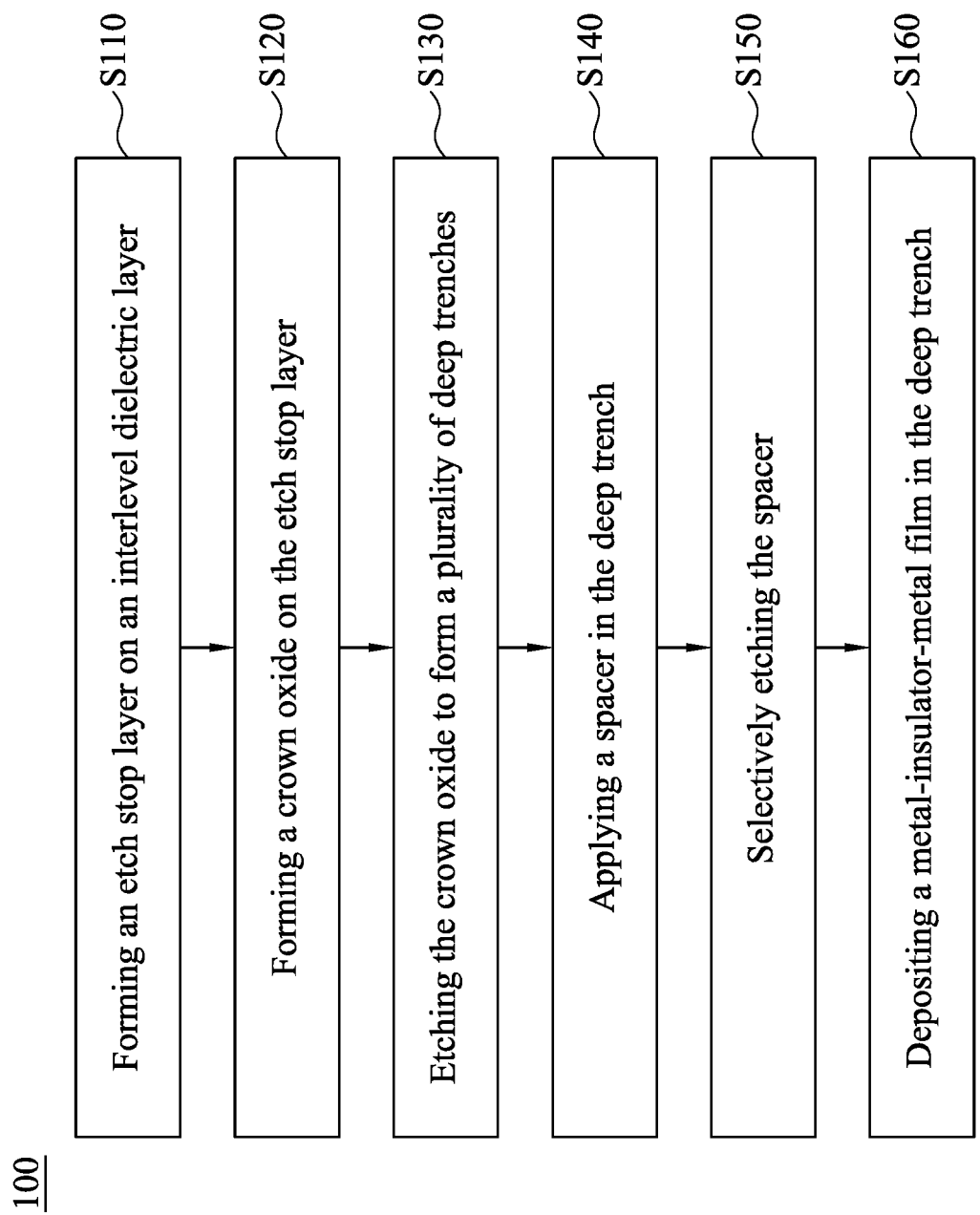
FIG. 3 is a flow chart showing a fabrication process of deep trench capacitor in accordance with some embodiments of the instant disclosure.
Figure 4A:
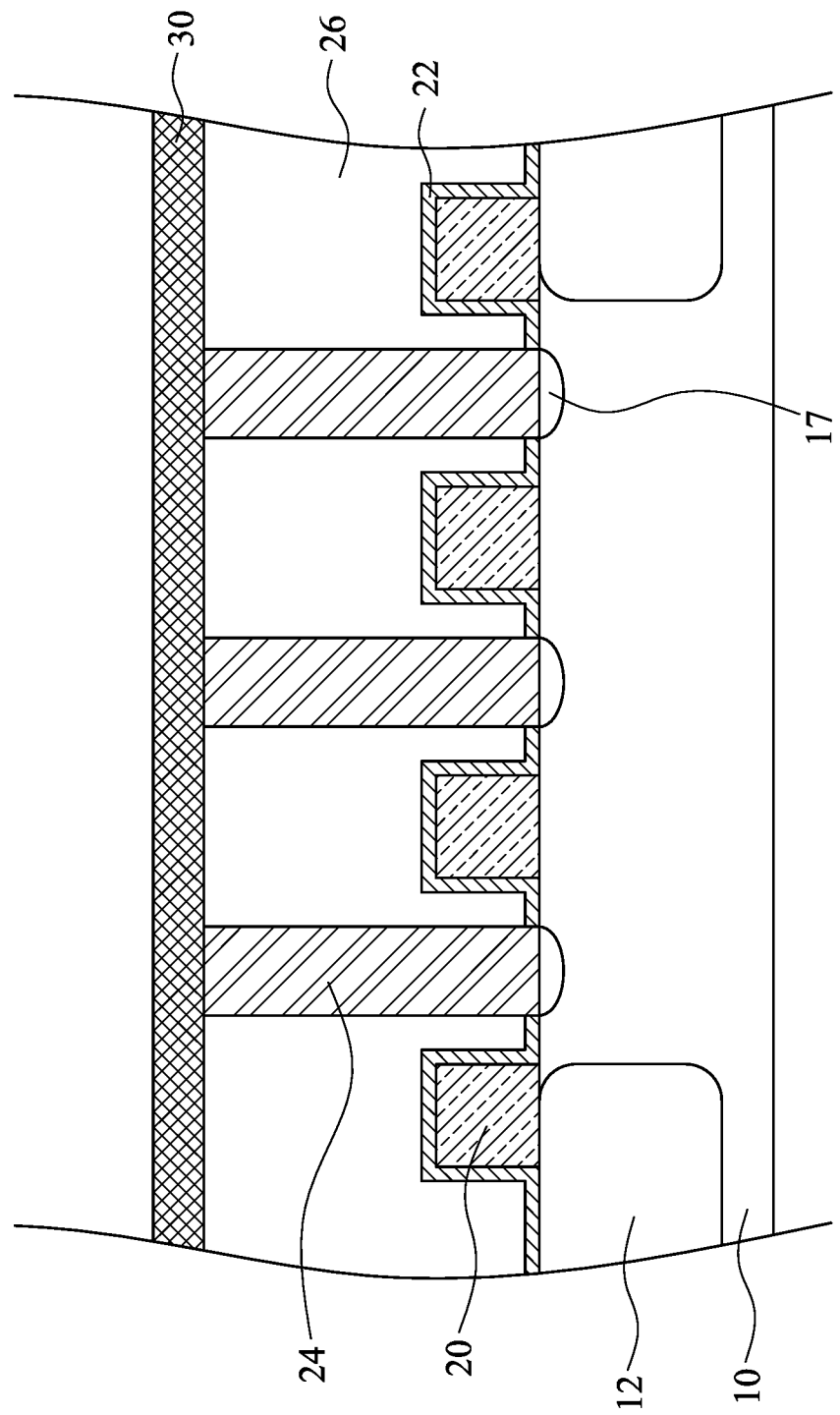
FIGS. 4A-4F are schematic elevation cross-sectional views for the sequence of process for fabricating a deep trench capacitor in accordance with some embodiments of the instant disclosure.

Turning now to FIG. 3, illustrated is an embodiment of a method 100 for fabricating a dynamic random access memory (DRAM) device including a metal-insulator-metal capacitor. Embodiments of the method 100 shown in FIG. 3 are further illustrated in the schematic diagrams of FIGS. 4A through 4F, and reference should be made to these figures as called out in the text below. It should be noted that FIG. 4A is a cross-sectional elevation view of the DRAM device. This same format is maintained throughout FIGS. 4A-4F.

As set forth in block S110 in FIG. 3, an etch stop layer is formed on an interlevel dielectric layer. This is illustrated in FIG. 4A, which shows a DRAM cell in partially completed stage. The DRAM cell includes a substrate 10, a plurality of gate electrodes 20, a plurality of first contact plugs 24 and second contact plugs 25 interposing in between each two first contact plugs 24. These DRAM cells are described only briefly since they are not essential for describing the novel features of the instant disclosure. Shallow trench isolation regions 12 are formed in the substrate 10 to isolate device regions. The shallow trench isolation regions 12 may be created with approaches including, but not limited to, etching trenches into the substrate, depositing isolating materials, polishing off the excess isolating materials and planarizing the trenches. On the device region, a gate dielectric layer and a gate electrode layer are successively formed on the substrate 10 and then patterned, forming gate dielectrics and gate electrodes 20. The gate dielectrics are formed of silicon oxide, silicon nitride, silicon oxynitride, silicon carbide, or other suitable dielectrics. The gate electrodes 20 are formed of doped polysilicon, metals, metal alloys or silicides. Source/drain regions 17 are then formed in the substrate 10, by implanting appropriate impurities depending on they type of device. In some embodiments, the source/drain regions 17 are of p-type. In alternative embodiments, the source/drain regions 17 are of n-type. An etch stop layer 22 is deposited on the gate electrodes 20, conformal to the waved contour. An interlevel dielectric (ILD) layer 26 is formed on the substrate 10 through, for example, LPCVD, APCVD or the like. Next, an etch back process is employed. The ILD layer 26 is recessed to accommodate the contact plugs 24. Materials of contact plugs 24 include tungsten or alloys thereof and further include a composite structure. Another etch stop layer 30 is formed on the ILD layer 26, planarizing the ILD layer and contact plugs 24.

Figure 4B:
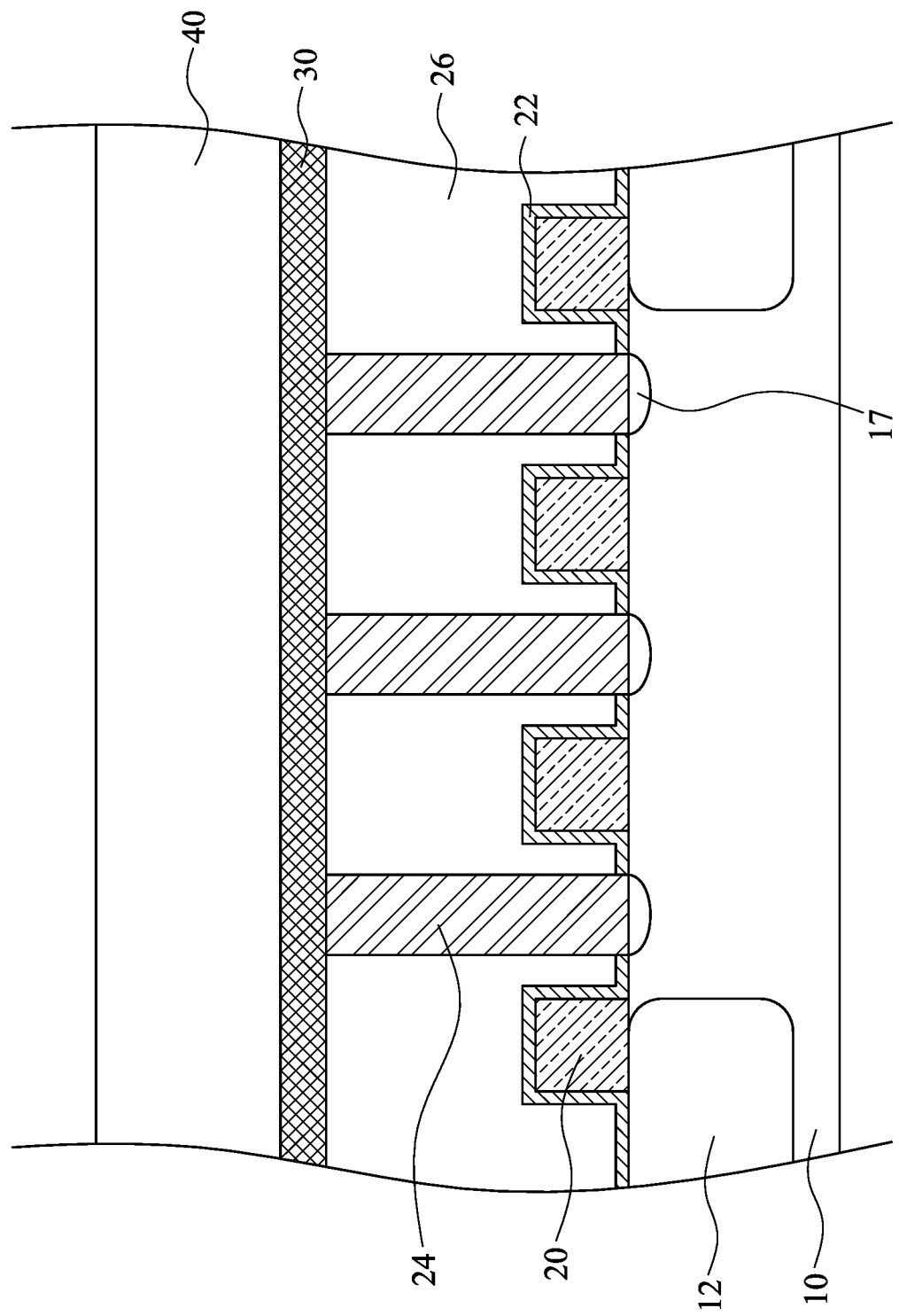

Returning to FIG. 3, a crown oxide is formed on top of the stop layer, as set forth in block S120. This is illustrated in FIG. 4B, where the crown oxide 40 have been formed on the etch stop layer 30. The crown oxide 40 is formed by CVD or LPCVD with high-k dielectric materials and then planarized. The thickness of the crown oxide 40 ranges between 6000 to 8000 Angstroms according to the type of device. In some embodiments, the crown oxide 40 has a thickness of 7200 Angstroms. The thickness of the crown oxide 40 later determines the depth profile of deep trenches.

Figure 4C:
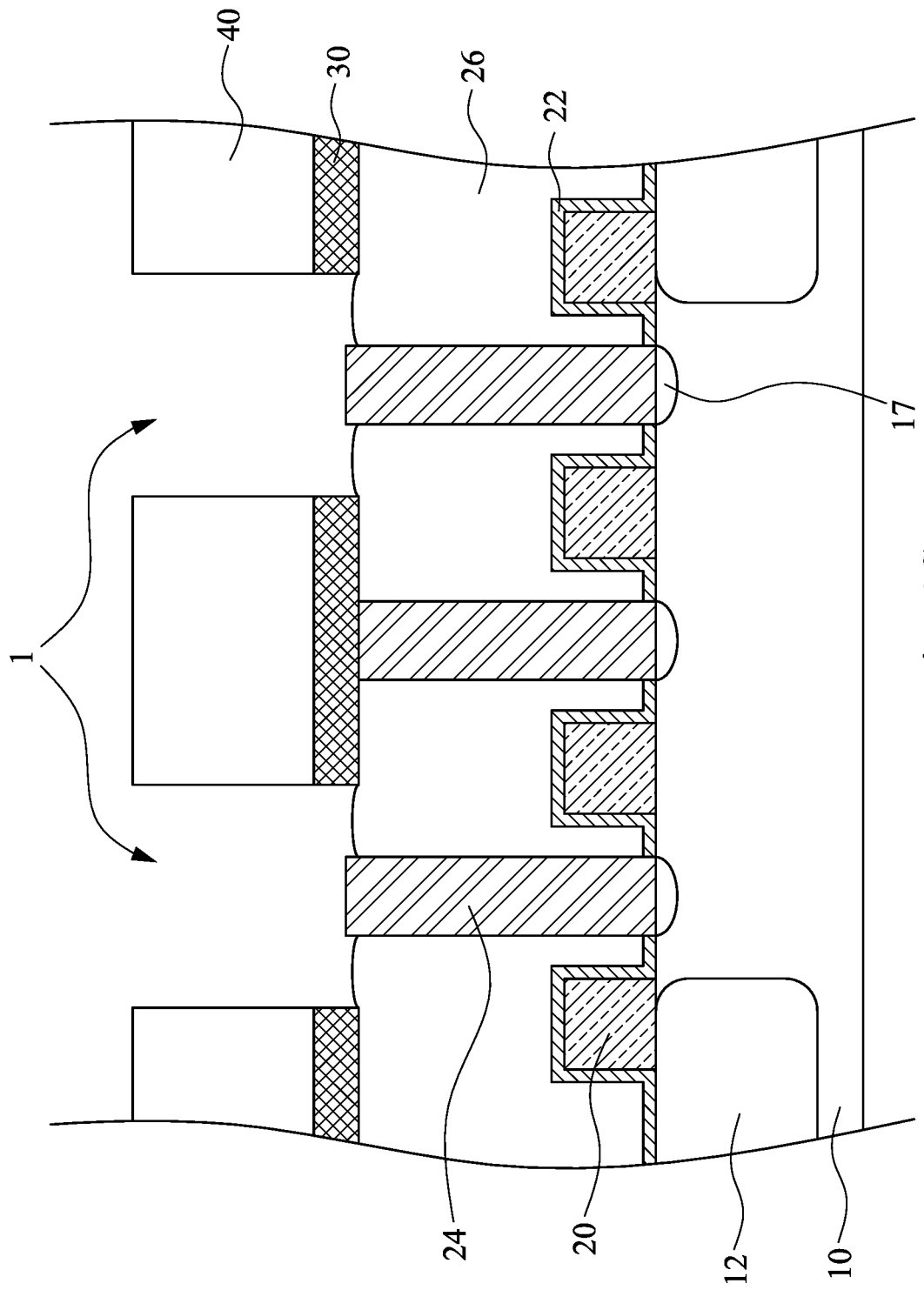

As set forth in block S130, the crown oxide is etched to form a plurality of deep trenches. This is illustrated in FIG. 4C, where the deep trenches 1 are formed in the crown oxide 40, exposing the contact plugs 24. The deep trenches 1 are formed by etching the crown oxide 40 and the etch stop layer 30. The depth of the deep trenches 1 is matched by the collective thickness of the crown oxide 40 and etch stop layer 30 until the contact plugs 24 are exposed. Due to the nature of etching back process, the bottom of the deep trenches 1 is slightly curved upwards toward the opening. The curvature results in narrow, acute sub-trench formation at the junction of two sidewalls. Deposition of layers in the deep trenches 1 will reproduce the narrow corners, and bulges may occur at nearby region to interrupt the smoothness of the film. Furthermore, cramming material into the narrow corner may bring undesired closeness or even merging of a single layer.

Figure 4D:
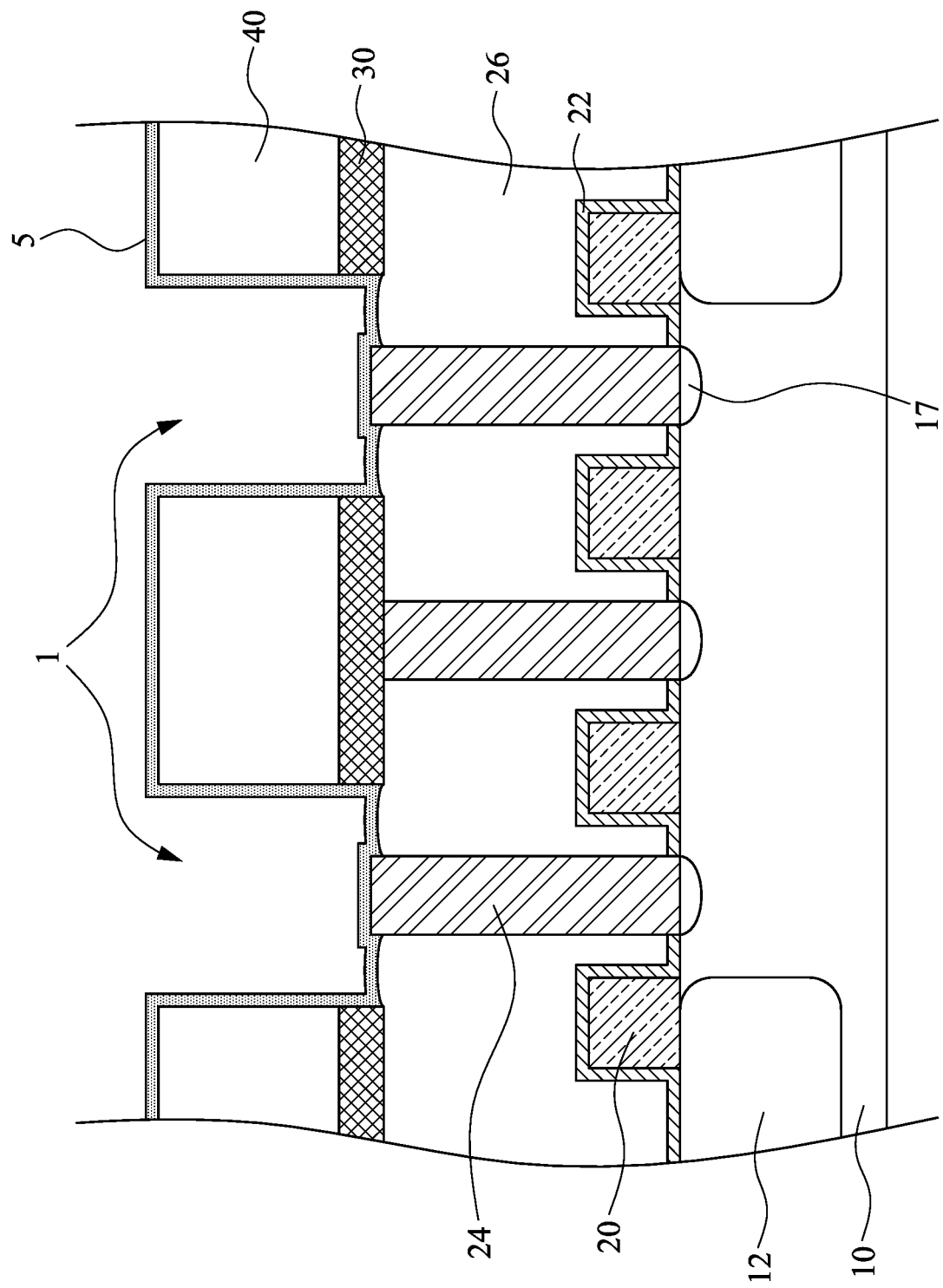

As set forth in block S140, a spacer is applied in the deep trenches. This is illustrated in FIG. 4D, where a spacer 5 is deposited into the deep trenches 1. The spacer 5 is formed by automatic layer deposition (ALD) with gas treatment. Materials of the spacer 5 may be, for example, silicon nitride or the like. It should be understood that the material of spacer 5 should not be oxide so as not to affect the normal function of the capacitor. The thickness of the spacer 5 ranges between 50 and 100 Angstroms according to desired result. A spacer thinner in profile has less effect, namely the aspect ratio, to the electrode. A thicker spacer may slightly compromise the capacitance of the electrode. At this stage, the spacer 5 is conformal to the deep trenches 1, and the sub-trenches are reproduced in the deposition.

Figure 4E:
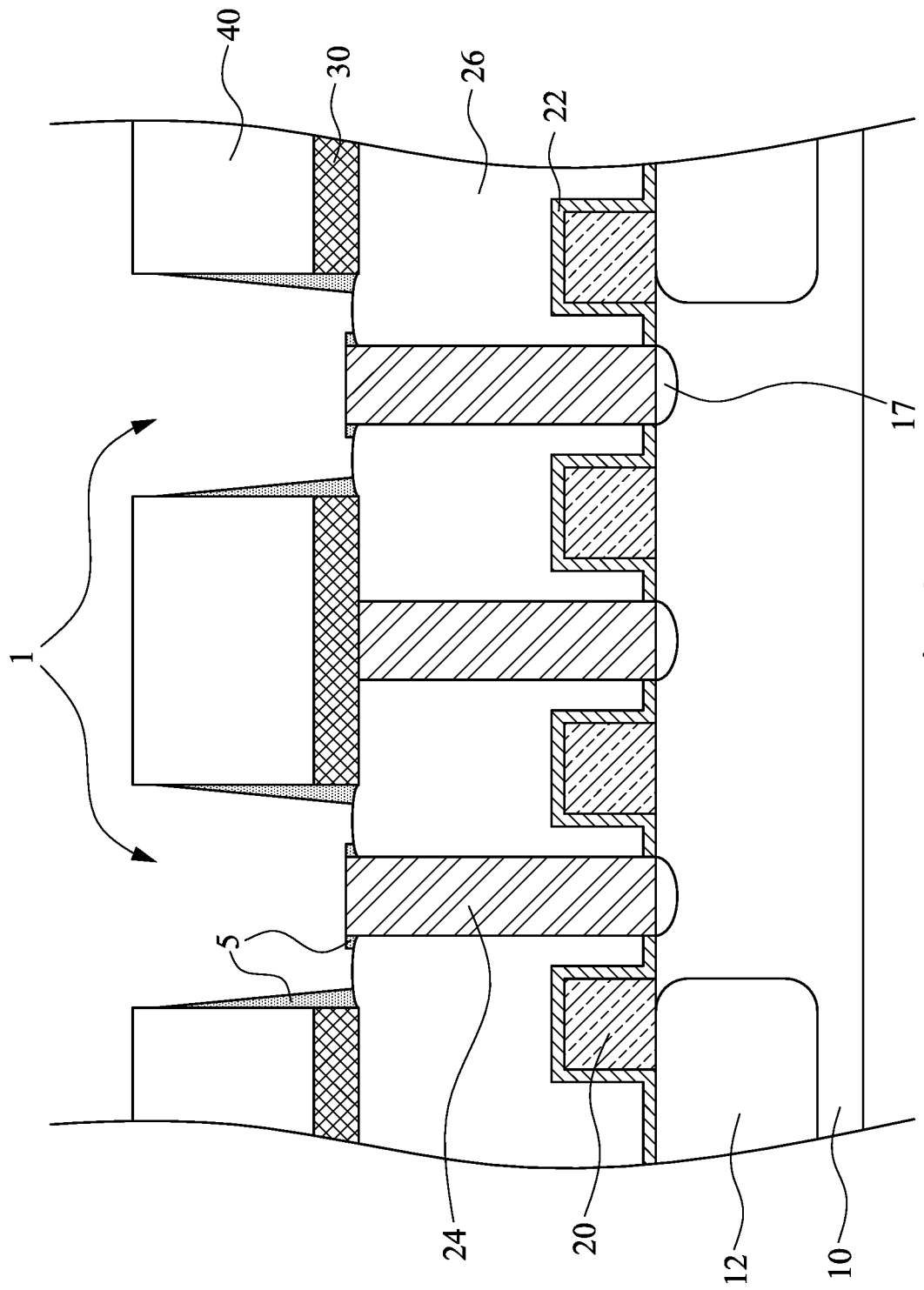

Next, as set forth in block S150, the spacer is selectively etched. This is illustrated in FIG. 4E, where the spacer 5 is selectively dry etched. In order to attenuate the sub-trenches, anisotropic etching is carried on the spacer 5. The spacer 5 is etched to non-uniform thickness and distributed at different regions in the deep trenches 1. After selective etching, the spacer 5 occupies the sub-trenches and acute angles at the bottom of the deep trenches 1. As shown in FIG. 4E, the sub-trenches are filled with the spacer 5, and therefore the corners are no longer sharp but more rounded. It should be understood that the bottom of the deep trenches is clear of the spacer 5. The purpose of the spacer 5 is to modify the sub-trenches and acute angles to more opened corners. If the spacer 5 remains at the bottom of the deep trenches 1, the sub-trenches and acute angles will be reproduced instead of being attenuated. The obtuse angles prevent metal-insulator-metal film 3 from cramming such that capacitance will not be compromised where deep trenches have high aspect ratio.

Figure 4F:
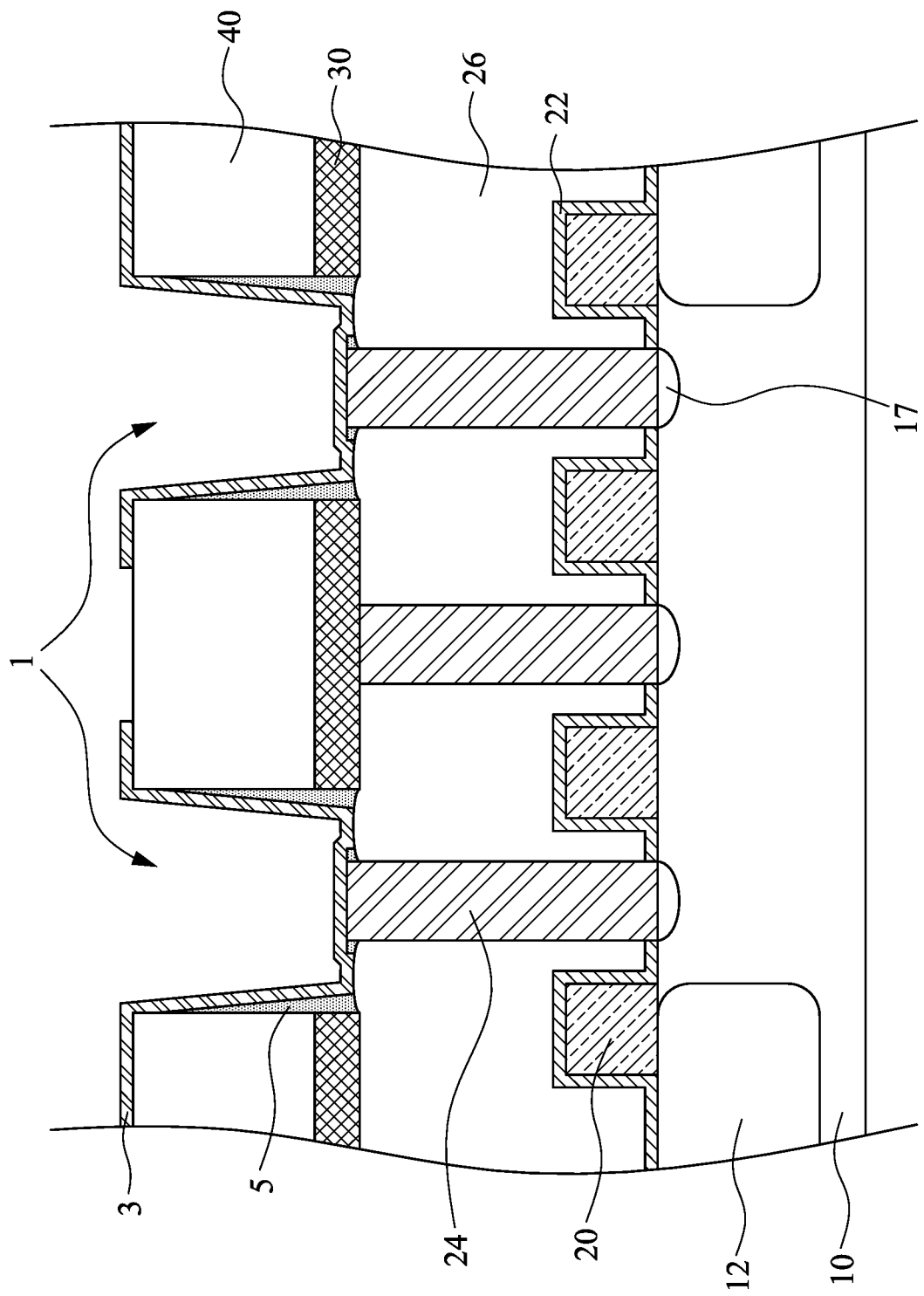

Referring now to FIG. 4F, where a metal-insulator-metal film 3 is deposited in the deep trenches 1 by, for example, CVD, sputter deposition or the like. The metal-insulator-metal film 3 includes a bottom electrode layer, a capacitor dielectric layer and a top electrode layer. For the sake of clarity, layers are not shown. Materials of the bottom and top electrode layers include, but not limited to, Ti, Co, TiN, TiW, W, TiAl, TiAlN and combination thereof. The metal-insulator-metal film 3 is not squeezed at the corner but deposited smoothly over the topology created by the spacer 5, contact plug 24 and the deep trenches 1. The aspect ratio of deep trench capacitor ranges between 8 and 10 after the deposition of the metal-insulator-metal film 3.

Although not shown, it should be understood that further processing can be carried out to the DRAM cell, which includes but not limited to forming a bitline contact plug over the remaining contact plug, depositing a second ILD layer exceeding the depth of the deep trenches, and forming a conductive layer as the bitline.

The instant disclosure provides a deep trench capacitor structure with modified deep trench profile. More specifically, a spacer is deposited before the deposition of a metal-insulator-metal film. Because of the high aspect ratio of deep trenches, after etch back process, the bottom of the trench is slightly curved and, sub-trenches are created between sidewall and the bottom. However, the width of the deep trenches can hardly broaden due to limited space, and therefore each deep trench should provide its maximum capacity without altering existing dimension. In this regard, the spacer fills in the sub-trenches with limited effect to the aspect ratio of the deep trench because the spacer is not uniform in thickness and discrete. The spacer modifies the contour of the deep trench to a cup having rounded corner such that the metal-insulator-metal film does not cram or jam at the corner, and the chance of capacitor leakage can be greatly reduced. The capacitance stability can be ensured and data loss can be avoided.

In some embodiments, a method of manufacturing a semiconductor device includes forming a source/drain region in a substrate. A first interlevel dielectric layer is formed on the substrate. A conducting plug is formed in the first interlevel dielectric layer, such that the conducting plug is electrically coupled to the source/drain region. A crown oxide is formed on the first interlevel dielectric layer. A deep trench is formed in the crown oxide to expose a top wall and a sidewall of the conducting plug. A spacer is formed on the sidewall of the conducting plug. A metal-insulator-metal film is formed in the deep trench.

In some embodiments, a method of manufacturing semiconductor device includes forming a source/drain region in a substrate. A first interlevel dielectric layer is formed on the substrate. A first conducting plug is formed in the first interlevel dielectric layer such that the conducting plug is electrically coupled to the source/drain region. A crown oxide is formed on the first interlevel dielectric layer. A deep trench is formed in the crown oxide to expose the first conducting plug. A spacer is formed in the deep trench such that the spacer is thicker at a bottom of the deep trench than at a top of the deep trench. A metal-insulator-metal film is formed in the deep trench.

In some embodiments, a method of manufacturing semiconductor device includes forming an etch stop layer over an interlevel dielectric layer. A crown oxide is formed on the etch stop layer. A deep trench is formed in the crown oxide. A spacer is formed in the deep trench. The spacer is selectively etched to remove the spacer at a top of the deep trench. A metal-insulator-metal film is formed in the deep trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a source/drain region in a substrate;
    forming a first interlevel dielectric layer on the substrate;
    forming a conducting plug in the first interlevel dielectric layer such that the conducting plug is electrically coupled to the source/drain region;
    forming a crown oxide on the first interlevel dielectric layer;
    forming a deep trench in the crown oxide to expose a top wall and a sidewall of the conducting plug;
    forming a spacer that is in contact with the sidewall of the conducting plug; and
    forming a metal-insulator-metal film in the deep trench and on the spacer that is in contact with the sidewall of the conducting plug.

2. The method of claim 1, further comprising:
    lining the spacer on a sidewall and a bottom wall of the deep trench; and
    removing the spacer on the bottom wall of the deep trench to expose the first interlevel dielectric layer.

3. The method of claim 1, further comprising:
    lining the spacer on a sidewall and a bottom wall of the deep trench; and
    thinning the spacer on the sidewall of the deep trench.

4. The method of claim 1, further comprising:
    depositing the metal-insulator-metal film on the spacer, the first interlevel dielectric layer, and the conducting plug.

5. The method of claim 1, further comprising:
    forming a second interlevel dielectric layer on the metal-insulator-metal film and the crown oxide; and
    forming a conductive layer on the second interlevel dielectric layer.

6. A method of manufacturing a semiconductor device, the method comprising:

forming a first source/drain region in a substrate;
forming a first interlevel dielectric layer on the substrate;
forming a first conducting plug in the first interlevel dielectric layer such that the first conducting plug is electrically coupled to the first source/drain region;
forming a crown oxide on the first interlevel dielectric layer;
forming a deep trench in the crown oxide to expose the first conducting plug such that the first conducting plug protrudes from the first interlevel dielectric layer;
forming a spacer in the deep trench such that the spacer is thicker at a bottom sidewall of the deep trench than at a top sidewall of the deep trench; and
forming a metal-insulator-metal film in the deep trench and in contact with the top sidewall of the deep trench, wherein a bottommost portion of the metal-insulator-metal film is higher than a bottommost portion of the spacer.

7. The method of claim 6, further comprising:
removing the spacer on a bottom wall of the deep trench to expose the first conducting plug and the first interlevel dielectric layer.

8. The method of claim 6, further comprising:
thinning the spacer on the top sidewall of the deep trench.

9. The method of claim 6, further comprising:
depositing the metal-insulator-metal film on the spacer, the first interlevel dielectric layer, and the first conducting plug.

10. The method of claim 6, further comprising:
forming a second conducting plug on a second source/drain region in the first interlevel dielectric layer.

11. The method of claim 10, further comprising:
forming a second interlevel dielectric layer on the metal-insulator-metal film and the crown oxide.

12. The method of claim 11, further comprising:
forming a third conducting plug in the crown oxide and the second interlevel dielectric layer, the third conducting plug being electrically coupled to the second conducting plug.

13. The method of claim 12, further comprising:
forming a conductive layer on the second interlevel dielectric layer, the conductive layer being electrically coupled to the third conducting plug.

14. The method of claim 6, further comprising:
forming an etch stop layer between the crown oxide and the first interlevel dielectric layer.

15. The method according to claim 6, wherein forming the spacer in the deep trench comprises:
forming a spacer layer in the deep trench after forming the deep trench of the crown oxide; and
selectively etching the spacer layer to form the spacer.

16. A method of manufacturing a semiconductor device, the method comprising:
forming an etch stop layer over a first interlevel dielectric layer;
forming a crown oxide on the etch stop layer;
forming a deep trench in the crown oxide;
forming a spacer on a bottom sidewall and a top sidewall of the deep trench;
selectively etching the spacer to expose the top sidewall of the deep trench;
forming a metal-insulator-metal film in the deep trench; and
forming a second interlevel dielectric layer inside the deep trench, wherein forming the deep trench is performed such that a portion of a top surface of the first interlevel dielectric layer is exposed by the deep trench and such that the exposed portion of the top surface of the first interlevel dielectric layer is convex.

17. The method according to claim 16, further comprising:
removing the spacer on a bottom wall of the deep trench.

18. The method according to claim 16, further comprising:
depositing the metal-insulator-metal film on the spacer on the bottom sidewall and a bottom wall of the deep trench.

19. The method according to claim 16, wherein a bottommost portion of the second interlevel dielectric layer is higher than a bottommost portion of the spacer.

20. The method according to claim 16, further comprising:
prior to forming the etch stop layer, forming a conducting plug in the first interlevel dielectric layer, wherein forming the second interlevel dielectric layer is performed such that a bottom surface of the second interlevel dielectric layer is higher than a top surface of the conducting plug.

* * * * *